United States Patent [19]

Adamian

[11] 4,053,823
[45] Oct. 11, 1977

[54] IGNITION ARC MONITOR CIRCUIT

[76] Inventor: Michael R. Adamian, P.O. Box 223, Naperville, Ill. 60540

[21] Appl. No.: 679,139

[22] Filed: Apr. 22, 1976

[51] Int. Cl.² .......................................... G01R 13/42
[52] U.S. Cl. .................................. 324/17; 324/60 C
[58] Field of Search ............... 324/17, 15, 16 T, 20 R, 324/60 CD, 60 C

[56] References Cited
U.S. PATENT DOCUMENTS

| | | | |
|---|---|---|---|
| 3,862,571 | 1/1975 | Vogel | 324/60 C X |
| 3,882,380 | 5/1975 | Black | 324/60 C |
| 3,904,955 | 9/1975 | Katz | 324/17 |
| Re. 27,829 | 12/1973 | Tiffany | 324/60 C X |

Primary Examiner—Stanley T. Krawczewicz

[57] ABSTRACT

Electronic apparatus for detection of improper arc in automotive vehicle ignition systems, and adapted for permanent installation in a vehicle, is disclosed. Ignition system dwell period and arc duration are measured for each ignition cycle and a visual indicator is enabled if the arc is less than desired duration.

10 Claims, 4 Drawing Figures

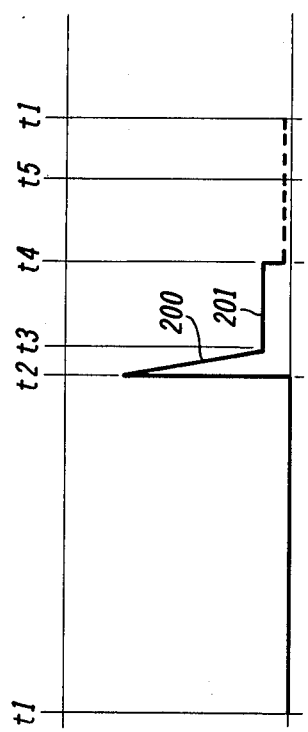
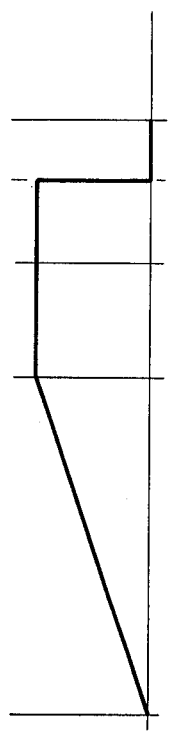
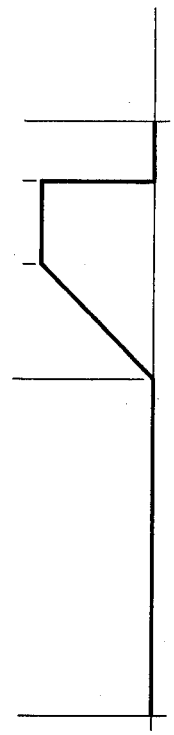
FIG. 2A
FIG. 2B
FIG. 2C

IGNITION ARC MONITOR CIRCUIT

BACKGROUND OF THE INVENTION

1. Field of the Invention

This invention relates to electronic apparatus for testing automotive ignition systems, and more particularly relates to apparatus for monitoring the duration of ignition arcs across spark plugs in internal combustion engines.

2. Description of the Prior Art

When engine ignition systems are properly tuned, engine performance is optimized and fuel consumption is reduced. However, deterioration in ignition performance results in incomplete combustion which reduces engine efficiency and results in increased fuel consumption. Furthermore, as a result of incomplete combustion gaseous mixtures, rich in hydro-carbons are discharged adding to pollution by the increased emission levels. Prior art ignition test instruments such as the oscilloscope are too complex and costly for the average automobile owner. Prior art ignition testing devices are generally intended for use during engine test and are not readily integrated into an automobile to allow for continuous monitoring.

SUMMARY OF THE INVENTION

It is the object of this invention to provide apparatus for monitoring the duration of the ignition arc and for indicating improper functioning of the ignition system.

In accordance with this invention, electronic circuitry is provided which senses ignition coil primary voltage during the energy storage or dwell period and during the arc discharge period. A first capacitor is charged during the dwell period and a second capacitor is charged during the arc discharge period. The resulting voltage on the respective capacitors are compared during a specified time interval in the ignition cycle by means of a differential amplifier. In the event that the comparison shows inadequate charge on the second capacitor, a silicon controlled rectifier is enabled which is latched in the "ON" position and activates an indicator. The two capacitors are discharged after the compare period and the test is repeated independent of the state of the indicator. Since the dwell period generally will be longer than the discharge period, the capacitors are charged at different rates such that the charge on the second capacitor will exceed slightly the charge on the first capacitor, after completion of the arc discharge period under proper operation of the ignition system. If the arc duration is shorter than desired, the charge on the second capacitor will be inadequate.

BRIEF DESCRIPTION OF THE DRAWING

FIG. 2A is a representation of a voltage waveform at input to the circuit, superimposed on a time diagram.

FIG. 2B is a time diagram representing voltage on a capacitor charged during the dwell period.

FIG. 2C is a time diagram representing voltage on a capacitor charged during the arc duration period.

DETAILED DESCRIPTION

Figure 1:
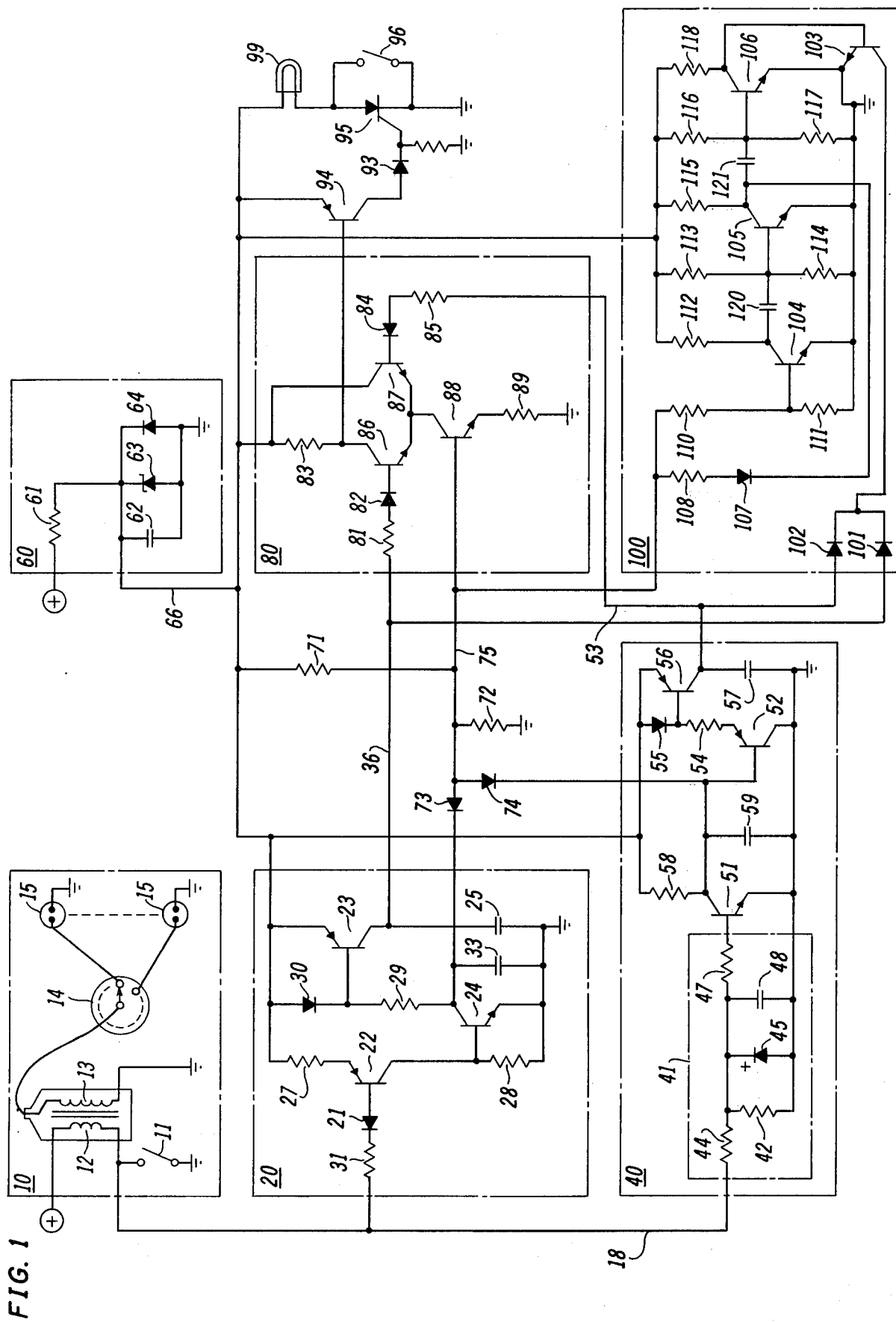
FIG. 1 is schematic representation of one embodiment of an ignition arc detector in accordance with this invention.

Commonly, automobile ignition systems consist primarily of a battery, ignition coil, periodically opening and closing contact points (or output transistor in performing the function of the points), a distributor and spark plugs as depicted generally at 10 in FIG. 1. The points 11 are controlled by means of a mechanism such as a cam (not shown) to be opened and closed in a predetermined cycle. The ignition cycle is represented in FIG. 2A as the period from $t1$ to $t1$. The time period of the cycle that the points remain closed is referred to in the art as "dwell." This is represented in FIG. 2A as the period from $t1$ to $t2$. When the points 11 are closed, current flows in the primary winding 12 generating a magnetic field in the coil. When the points 11 are opened at the end of the dwell period ($t2$) the magnetic field collapses rapidly and a high voltage is induced in the secondary winding 12. The high secondary coil voltage is applied to spark plugs 15 by means of a known distributor 14. The well-known spark plugs, which are inserted in the cylinders of an internal combustion engine, have an air gap of a specified dimension. Initially, the spark plug acts as an insulator. When the voltage applied to the plug reaches the potential required for ionization of the gaseous mixture in the engine cylinder, a low impedance ionized arc is formed across the gap. The duration of the arc will depend upon the energy stored in the coil and is referred to as "arc duration." This is represented in FIG. 2A as the period from $t2$ to $t4$.

A wave form representing the high voltage induced in the secondary coil 13 is shown in FIG. 2A. The figure shows high voltage build-up at the end of the dwell period at 200 and a lower sustained voltage during the arc period shown at 201. The voltage in the secondary winding 13 is reflected to the primary winding 12 and the voltage wave form on conductor 18 may also be represented by the waveform of FIG. 2A. The arc begins time $t3$ which occurs at some time shortly after $t2$, upon ionization of the gas in the spark gap. The arc will continue until the energy build-up in the coil has been dissapated, at time $t4$. FIG. 2B represents voltage build-up on capacitor 25 during the dwell period ($t1$ to $t2$) and FIG. 2C represents voltage build-up on capacitor 57 during the arc period ($t2$ to $t4$).

The circuitry represented schematically in FIG. 1 comprises a dwell sensing circuit 20, which charges a capacitor 25 during the dwell period, that is, the period between $t1$ and $t2$. The conductor 18 is substantially at ground potential when the points 11 are closed. This allows the PNP transistor 22 to conduct current from its emitter to collector causing a voltage drop across resistor 28. Consequently, the NPN transistor 24 goes into the conducting state. The current flow through the transistor 24 causes current flow in resistor 29, the diode 30 and through the PNP transistor 23. The parameters of the diode 30 and the transistor 23 are chosen such that the forward voltage drop of the diode 30 is very nearly the same as the base-to-emitter (VBE) voltage drop of the transistor 23.

It is well-known that when two transistors having substantially the same characteristics (e.g., VBE) have the same base and emitter voltages, their collectors will conduct the same currents. Such equivalent collector current is known in the art as "mirror current." The diode 30, being equivalent to a transistor having its base terminal connected to its collector terminal, will conduct very nearly the same current as the transistor 23. Since base current of the transistor 23 is very small compared to the current conducted in the diode 30, the current conducted by the transistor 23 is approximately the same as the current in resistor 29. Accordingly, the charging current which determines the rate of charge of the capacitor 25 may be controlled by selection of the appropriate value of the resistor 29. The voltage build-up may be represented by a ramp as shown in FIG. 2B if the charging current is relatively constant.

When the points 11 are opened, at time t2, the voltage on conductor 18 rises rapidly as represented at 200 in FIG. 2A. Consequently, PNP transistor 22 will switch to a non-conducting state and the charge current to capacitor 25 will be turned off. The voltage on conductor 18 typically may be anywhere from 30 volts to approximately 100 volts. A portion of this potential is applied to the base of the NPN transistor 51, by means of the input network 41. As a consequence, PNP transistors 52 and 56 will begin to conduct current from their emitters to their respective collectors. As described earlier herein with respect to diode 30 and transistor 23, the current flow in a diode connected between the base and emitter of a transistor is approximately the same as the emitter to collector current of the transistor if the forward voltage drop of the diode is approximately the same as the base to emitter voltage drop (VBE) of the transistor. Accordingly, assuming that the devices are selected such that the necessary voltage drops are nearly equal, the current flow to capacitor 57 will be approximately equal to the current flowing through diode 55 which is approximately equal to the current flowing in resistor 54 and transistor 52. Hence, the rate of charge of the capacitor 57 may be controlled by the proper selection of the value of resistor 54.

A positive potential will remain on conductor 18 during the duration of the arc, i.e., during the entire period between t2 and t4 indicated in FIG. 2A. When the voltage is reduced to near zero at time t4, transistors 51, 52 and 56 will be turned off, terminating the charge current to capacitor 57. For comparatively constant charge currents, the charge build-up on capacitor 57 may be represented by a ramp as shown in FIG. 2C.

Since the voltage on conductor 18 may vary from 0 volts to over 100 volts, protective circuitry is provided between transistors 22 and 51 and the conductor 18. The diode 21 protects transistor 22 from high voltage, and resistor 31 serves to provide a threshold. Resistors 44 and 42 comprise a voltage divider and resistor 47 serves to limit the current to the base of transistor 51. The capacitor 48 is provided to dampen any transient voltage and zener diode 45 serves to prevent excessively high voltages from reaching the base of transistor 51.

A comparator 80 comprising transistors 86 and 87 is connected to capacitors 25 and 57. Capacitor 25 is connected to transistor 86 by means of conductor 36 and resistor 81 and diode 82. Capacitor 57 is connected to transistor 87 by means of conductor 53, resistor 85 and diode 84. Transistors 86 and 87 are connected at their respective emitters and the connection from the emitters to ground is through transistor 88 and resistor 89. Thus the comparator circuit is enabled only when transistor 88 is conducting. As will be explained later herein, the transistor 88 will be placed in the conducting state, to temporarily enable the comparator after completion of the arc. If, after enablement of the comparator, the voltage on capacitor 57, as applied to the base of transistor 87, is greater than that of capacitor 25, transistor 87 will conduct and no substantial current will flow in transistor 86. The transistor 86 will conduct only if the voltage on capacitor 25 is greater than that on capacitor 57. In that case, transistor 94 will be placed in the conducting state, enabling the silicon controlled rectifier (SCR) 95, which, in turn will cause lamp 99, or like indicator, to be activated. Diode 93 is provided in the indicator circuit to prevent voltage from being conducted from the SCR 95 to the remainder of the circuit. Switch 96 represents a reset switch to allow the indicator to be reset by temporarily shunting current external to the SCR 95. Resistor 83 is provided to isolate the base of transistor 94 from the power supply conductor 66.

The ratio of the dwell period to arc duration varies depending on the operating characteristics of the engine, and may be readily established for most internal combustion engines. For optimum operation of the circuit described above, the values of resistors 29 and 54 should be selected such that the charge built up on capacitor 25 during the dwell period is slightly smaller than that built up on capacitor 57 during the arc duration period, under optimum engine operation. Any significant degredation of the arc duration will be noticed under such circumstances, since the comparator circuit 80 will readily detect the condition where the charge on capacitor 25 is larger than that on capacitor 57. The actual duration of the ignition cycle varies with engine RPM, since the spark plug firing frequency increases with RPM. The dwell and arc periods, however, vary in approximately the same manner with variation in RPM. Hence, the ratio of charging time of the capacitor 25 and 57 is substantially unaffected by change in RPM and the circuit provides a reliable ignition system test at any engine RPM.

The circuitry shown generally at 100, represents timing circuitry for temporarily enabling the comparator and for discharging the capacitors 25 and 57.

The base drive for the comparator enabling transistor 88 is provided from the supply conductor 66 via resistor 71 and conductor 75. During the dwell and arc duration periods, current will be diverted from conductor 75 primarily by means of diode 73 or diode 74, since during these periods either transistor 24 or transistor 51 will be in the conducting state. When neither of these last mentioned transistors is in the conducting state, current supplied to conductor 75 by resistor 71 will tend to divide between resistors 108 and 110, thereby further preventing the enabling of the comparator. When neither diode 73 or diode 74 is conducting, i.e., after completion of the arc at t4, transistor 104 is turned on by virtue of current flow in resistors 110 and 111. When transistor 104 is turned on, transistor 105 is turned off temporarily until such time as charge on capacitor 120 has been restored. During the period that transistor 105 is turned off, current flow through resistor 108 and diode 107 will substantially cease to flow causing transistor 88 to be switched to the conducting state, thereby enabling the comparator 80. During this same period, a charge will build up on capacitor 121. When transistor 105 is turned-on once again, capacitor 121 will be discharged causing transistor 106 to be turned off temporarily, until such time as the voltage at the base of transistor 106 once again reached the turn-on level. When transistor 106 is off, transistor 103 will be turned on causing the capacitors 25 and 57 to be discharged through diodes 101 and 102 respectively. It will be apparent to those skilled in the art, that the values of the resistors and capacitors may be readily selected to obtain the proper current division and time delay to allow for proper comparison and discharge of the capacitors 25 and 57. In FIGS. 2A through 2C, the discharge of the capacitors is shown to occur at time t5. Capacitors 33 and 59 provide for slow turn-off of transistors 24 and 51, respectively, to avoid untimely comparison or capacitor discharge.

The circuitry at 60 represent a voltage regulation circuitry comprising resistor 61, capacitor 62, zener diode 63, and diode 64.

It is to be understood that the above described arrangement is merely illustrative of one application of the invention, and that numerous other arrangements may be devised by those skilled in the art without departing from the spirit and scope of invention. It will be recognized, for example, that the voltage on capacitor 57 may be measured against a fixed potential by connecting the base of transistor 86 to a reference voltage. In such a case, the capacitor 25 and its associated circuitry could be eliminated. The reference voltage should be selected to be smaller than the voltage level to be built-up on capacitor 57 at high RPM.

What is claimed is:

1. Ignition arc monitor circuit for use with an internal combustion engine having an ignition system having a defined operating cycle, comprising:
   a first capacitor;
   first circuit means for charging said first capacitor during a first portion of said operating cycle;
   a second capacitor;
   second circuit means for charging said second capacitor during a second portion of said cycle; and
   means for comparing the charge on said first and second capacitors and for providing a fault indication if the charge on said second capacitor is less than on said first capacitor.

2. An ignition arc monitor circuit for use with an engine ignition system having a defined operating cycle, means for storing energy during a first part of said cycle, means for discharging said stored energy during a second part of said cycle, and comprising:
   first charge storage means for storing charge during said first part of said cycle at a first rate;
   second charge storage means for storing charge during said second part of said cycle at a second rate; and
   means for comparing charge stored on said first and said second charge storage means during a third part of said cycle.

3. An ignition arc monitor circuit for use with an engine ignition system having an ignition coil comprising primary and secondary windings, circuit means for periodically connecting one side of said primary winding to a ground potential and a spark plug for discharging energy induced in said secondary winding from said primary winding, said monitor circuit comprising:
   a first and second capacitors;
   a capacitor charging circuit for charging said first capacitor at a first charge rate during the period that said primary winding is connected to ground potential and charging said second capacitor at a second rate during the period that said energy of said secondary winding is discharged through said spark plug;
   indicator means; and
   comparator means for comparing the charge stored on said first and said second capacitors after completion of said discharge and for enabling said indicator means if the charge on said first capacitor exceeds the charge on said second capacitor.

4. An ignition arc monitor circuit in accordance with claim 3, and further comprising circuit means including delay circuit means for discharging said first and second capacitors a selected period of time after completion of said discharge of said secondary winding.

5. An ignition arc monitor circuit for use with an engine ignition system having a defined operating cycle, and having an induction coil for storing energy during a first part of said cycle and discharging said energy during a second part of said cycle, comprising:
   first circuit means for generating and recording a first analog signal indicative of duration of said first part of said cycle;
   second circuit means for generating and recording a second analog signal indicative of duration of said second part of said cycle; and
   signal comparing circuit means for comparing said first and said second analog signals recorded by first and said second circuit means, during a third part of said cycle.

6. In combination, an internal combustion engine ignition system having a periodic operating cycle and an ignition monitoring system, said ignition system comprising an ignition coil which is charged and discharged in each ignition cycle, and said monitoring circuit comprising:
   first and second capacitors;
   first circuit means connected to said coil for charging said first capacitor during the period of charging of said coil;
   second circuit means connected to said coil for charging said second capacitor during the period of discharging of said coil;
   comparator means responsive to a comparator enable signal for comparing charge on said first and said second capacitor and for generating an output signal when the charge on said second capacitor is less than the charge on said first capacitor; capacitor discharge means responsive to a discharge enable signal for discharging said first and said second capacitor;
   timing means for generating said comparator enable signal after completion of said period of discharge of said coil and for generating said discharge enable signal a predetermined period of time after generation of said comparator enable signal.

7. The combination in accordance with claim 6, wherein said
   first and second circuit means comprise means for controlling the rate of charge of said capacitors.

8. In combination, an ignition arc monitor circuit and an
   ignition system having an ignition coil comprising primary and secondary windings, means for periodically energizing said primary winding and an ignition spark plug for discharging energy induced in said secondary winding from said primary winding, said monitoring circuit comprising:
   first and second capacitors;
   first circuit means connected to said primary winding for charging said first capacitor to a charge proportional to the period of energization of said primary winding;
   second circuit means connected to said primary winding for charging said second capacitor to a charge proportional to the period of discharge of induced energy from said secondary winding through said ignition spark plug;
   comparator circuit means for comparing charge stored on said first and said second capacitor and for generating an output signal when charge stored on said first capacitor exceeds charge stored on said second capacitor;
capacitor discharge circuit means for discharging said capacitors;
timing circuit means for temporarily enabling said comparator means to compare charge on said capacitors and to generate said output signal and for enabling said discharge circuit means after enabling said comparator means; and
indicator means responsive to said output signal to provide a fault indication.

9. In combination, an internal combustion engine ignition system having a periodic operating cycle of variable duration, and an ignition monitoring system, said ignition system comprising an ignition coil which is charged for a first time period and discharged for a second time period in each operating cycle, said first and said second time periods being of variable duration proportional to the duration of each operating cycle, and said monitoring circuit comprising:
a capacitor;
a capacitor charge circuit connected to said ignition coil for charging said capacitor to a potential proportional to said second time period;
a source of reference potential proportional to said first period of the shortest anticipated operating cycle;
comparator means responsive to an enable signal for comparing said potential of said capacitor with said reference potential and for generating an output signal when said reference potential exceeds the potential of said capacitor;
timing means for generating said enable signal each time after completion of said period.

10. In combination, an ignition arc monitor circuit and an ignition system having an ignition coil comprising primary and secondary windings, means for periodically energizing said primary winding, and an ignition spark plug for discharging energy induced in said secondary winding from said primary winding;
first circuit means connected to said coil for generating a first output signal representative of the period of energization of said primary winding;
second circuit means connected to said coil for generating a second output signal representative of the period of discharge of induced energy through said spark plug;
comparator circuit means responsive to a comparator enable signal for comparing said first and said second output signals and for generating a comparison signal indicative of the relative values of said output signals;
circuit means for generating said comparator enable signal after completion of said period of discharge of said induced energy through said spark plug.

* * * * *